(12) United States Patent
Crippa

(10) Patent No.: US 9,429,593 B2
(45) Date of Patent: Aug. 30, 2016

(54) TESTING HEAD FOR A TEST EQUIPMENT OF ELECTRONIC DEVICES

(75) Inventor: Roberto Crippa, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 713 days.

(21) Appl. No.: 13/413,169

(22) Filed: Mar. 6, 2012

(65) Prior Publication Data

US 2012/0280703 A1 Nov. 8, 2012

(30) Foreign Application Priority Data

Mar. 7, 2011 (IT) .............................. MI2011A0352

(51) Int. Cl.
*G01R 1/067* (2006.01)
*G01R 1/073* (2006.01)

(52) U.S. Cl.
CPC ......... *G01R 1/0675* (2013.01); *G01R 1/07371* (2013.01); *G01R 1/07307* (2013.01); *G01R 1/07342* (2013.01)

(58) Field of Classification Search
CPC ............ G01R 31/31905; G01R 31/26; G01R 1/07357; G01R 1/06738; G01R 1/0675; G01R 1/06755; G01R 1/06733; G01R 1/0466; G01R 1/06722; D01H 1/164

USPC ......... 324/754.03, 755.01–755.09, 537–538, 324/55.01, 756.02, 754, 750.25, 762.01, 324/754.08, 754.11; 29/885, 874; 439/66

See application file for complete search history.

(56) References Cited

U.S. PATENT DOCUMENTS

| 6,847,221 | B2* | 1/2005 | Kimoto et al. | 324/755.06 |
|---|---|---|---|---|
| 7,245,138 | B2* | 7/2007 | Jeong et al. | 324/754.08 |
| 7,301,354 | B2* | 11/2007 | Crippa et al. | 324/754.11 |
| 8,671,567 | B2* | 3/2014 | Hirakawa et al. | 29/885 |
| 2002/0024347 | A1* | 2/2002 | Felici et al. | 324/754 |
| 2002/0155736 | A1 | 10/2002 | Kimoto et al. | |
| 2005/0258844 | A1 | 11/2005 | Kister | |

FOREIGN PATENT DOCUMENTS

WO 2010/095521 A1 8/2010

OTHER PUBLICATIONS

NPL STIC Search Report for U.S. Appl. No. 13/413,169.*

* cited by examiner

*Primary Examiner* — Melissa Koval
*Assistant Examiner* — Felicia Farrow
(74) *Attorney, Agent, or Firm* — Seed IP Law Group PLLC

(57) ABSTRACT

A testing head for a test equipment of electronic devices comprises a plurality of contact probes inserted into guiding holes made in at least one upper guide and in a lower guide, separate from one another by an air zone, the contact probes comprising at least one enlarged portion suitable for preventing the escape of such probes from the guiding holes. Conveniently, the enlarged portions of the contact probes adjacent according to a direction of distribution of contact pads of an integrated device to be tested have respective larger sides orthogonal to one another.

18 Claims, 8 Drawing Sheets

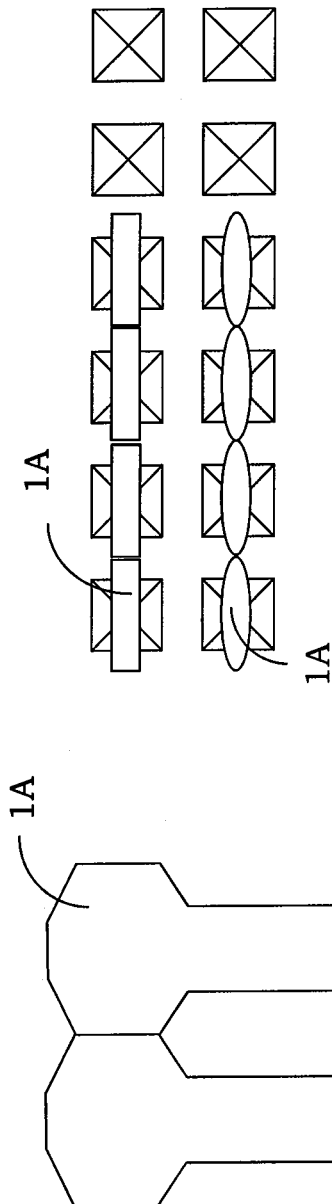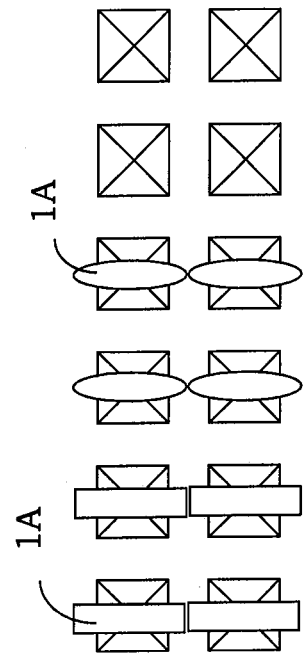

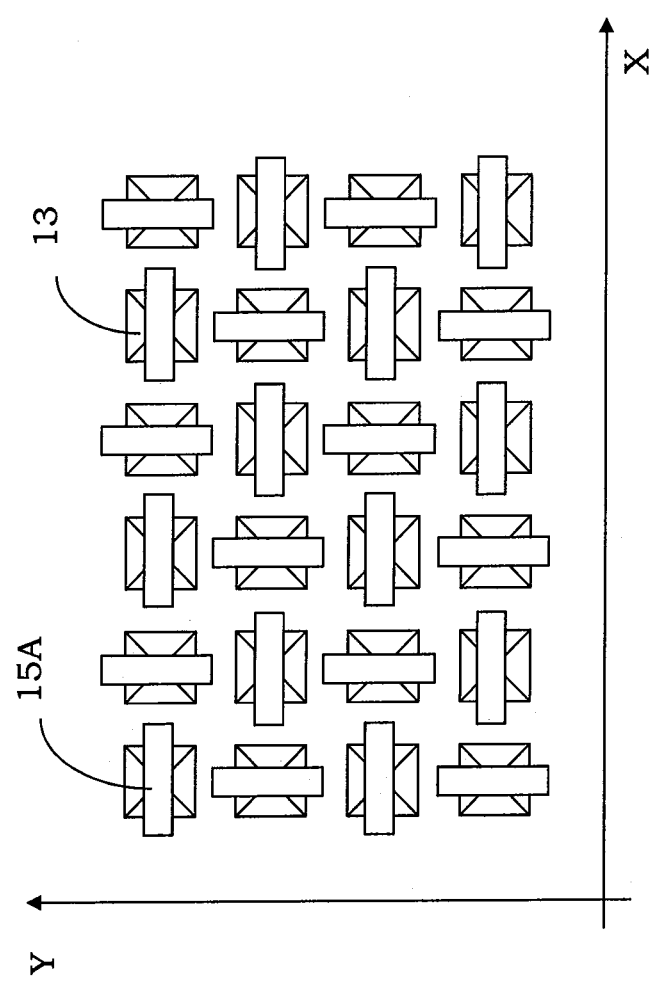

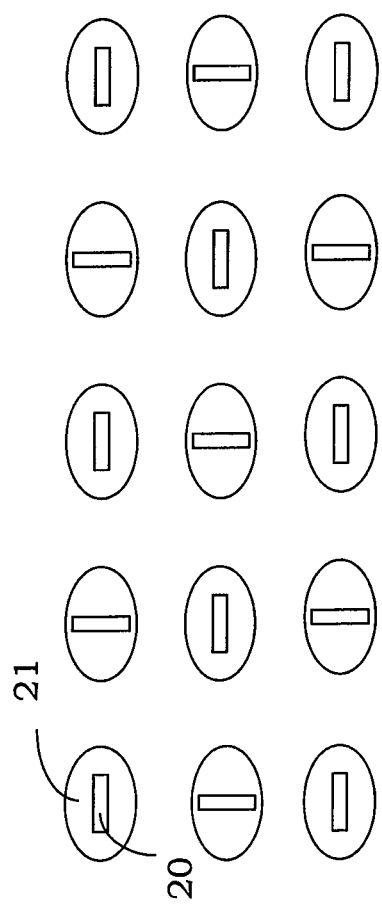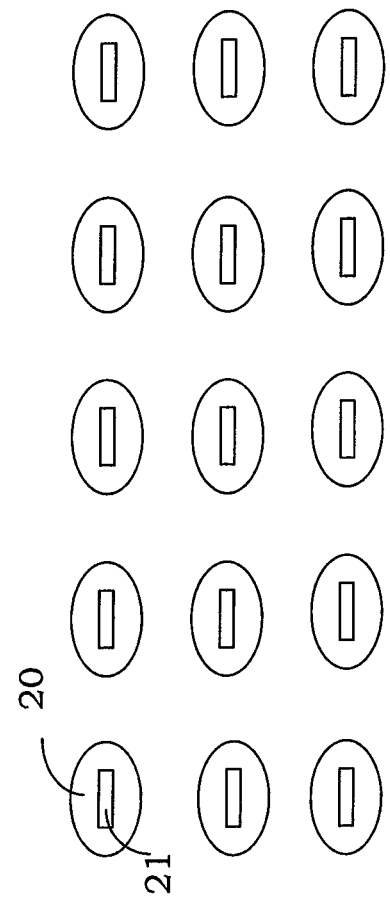
FIG. 7A
FIG. 7B

TESTING HEAD FOR A TEST EQUIPMENT OF ELECTRONIC DEVICES

TECHNICAL FIELD

The present disclosure relates to a testing head for a test equipment of electronic devices.

In particular but not exclusively, the disclosure relates to a testing head for a test equipment of electronic devices integrated on wafers and the following description is made with reference to this field of application only for simplifying the description thereof.

DESCRIPTION OF THE RELATED ART

As is well known, a testing head is a device suitable for setting a plurality of contact pads of a microstructure, in particular an electronic device integrated on a wafer, in electrical connection with corresponding channels of a measurement machine that performs the functionality check thereof, in particular the electrical one, or generically the test.

The test of integrated devices is used, in particular, to detect and insulate faulty devices already in the manufacturing step. Normally, testing heads are therefore used for the electrical testing of integrated devices on a wafer prior to cutting (or dicing) and assembling the same within a package for containing chips.

A testing head essentially comprises a plurality of mobile contact elements or contact probes retained by at least one pair of plates or guides substantially plate-shaped and parallel to one another. Such guides are provided with special holes and placed at a certain distance from each other so as to leave a free zone or air zone for the movement and the deformation, if any, of the contact probes. The pair of guides, in particular, comprises an upper guide and a lower guide, both provided with guiding holes within the contact probes, normally formed by wires of special alloys with good electrical and mechanical properties, axially slide.

The proper connection between the contact probes and the contact pads of the device being tested is ensured by the pressure of the testing head onto the same device, the contact probes, mobile within the guiding holes made into the upper and lower guides, undergoing a bending upon such pressing contact, within the air zone between the two guides and a sliding within such guiding holes. Testing heads of this type are commonly denoted as vertical probe heads and indicated by the English term "vertical probe".

The set of contact probes and guides forms the so-called testing head or probe head.

The contact probes have a contact tip that abuts onto corresponding contact pads of a device to be tested, performing the mechanical and electrical contact between said device and a test equipment whereof such testing head forms an end element. Usually, the contact probes have a further contact tip (also called contact head) towards a plurality of contact pads of the space transformer.

Normally, moreover, there are provided bonding wires that connect contact pads of the space transformer with corresponding contact pads of a so-called load board.

A critical parameter in making a testing head is the distance (the so-called pitch) between the centers of the contact pads of the device to be tested. The pitch of integrated electronic devices, with the advancement of the relative manufacturing technologies, has in fact become increasingly smaller, forcing to a high packing of the contact probes into the testing head, and causing positioning problems when the reciprocal contact between the probes has to be prevented.

A distribution of contact pads in line is for example schematically shown in FIG. 1A. In the most recent technologies, the distance between the centers of the contact pads of the device to be tested, that is, pitch P indicated in the figure, has decreased down to values comprised between 30 µm and 80 µm. This pitch decrease affects matrix pad configurations in an even more stringent manner, as shown in FIG. 1B. In that case, the distances between the contact centers of pads on a same line or on a same column, always called pitch and indicated in the figure as P1 and P2, respectively, are decreased down to values comprised between 30 µm and 80 µm.

As already said, this decrease of the pitch value of the contact pads configurations of the newer devices to be tested causes problems related to the contact between adjacent probes, and in particular of projecting portions thereof.

As illustrated in FIG. 2A, in fact, a contact probe 1 normally has at least one enlarged portion, in particular "squeezed", in correspondence of a head portion of the probe (portion 1A), which limits even more the possibility of moving adjacent probes close to each other. In particular, the enlarged portions of the contact probes are used for ensuring that the probes may not come out of the corresponding guiding holes made in the upper guide or in the lower guide of the testing head and therefore they have greater sections with respect to the rest of the contact probe, in particular at least one diameter larger than the diameter of the probe body, by diameter meaning the dimension with greater extension of such sections.

The increased dimensions of the enlarged portions of the contact probes cause the packing problems mentioned above, indeed, as they are the zones where the contact between adjacent probes is more likely, as indicated in FIGS. 2B and 2C, relative to a longitudinal or cross direction, respectively, of a matrix distribution of the pads of the integrated device to be tested. Such problem of contact of the squeezed portions is found both in probes with circular section (with oblong squeezed portions) and for probes with rectangular section (with rectangular squeezed portions), as shown.

BRIEF SUMMARY

An embodiment of the present disclosure is directed to a testing head provided with a plurality of contact probes for the connection to a test equipment of electronic devices, in particular integrated on wafer, having such structural and functional features as to allow overcoming the limits and the drawbacks that still afflict the systems made according to the prior art, in particular preventing any contact between adjacent probes and more in particular, of the squeezed portions thereof, also in case of high packing of the contact probes for very close configurations of contact pads, that is, with very little pitch.

The testing head comprises contact probes arranged so that adjacent probes have respective squeezed portions orthogonal to each other, reducing the risk of contact between probes and allowing the reduction of the distance between the probes and therefore the distance (pitch) of the centers of the contact pads of the integrated device to be tested.

In particular, adjacent probes are those consecutive according to the distribution direction of the corresponding contact probes of the integrated device to be tested, as well as those consecutive according to a longitudinal or cross direction in the case of a matrix distribution of the contact pads.

The testing head for a test equipment of electronic devices of the present disclosure comprises a plurality of contact probes inserted in guiding holes made in at least one upper guide and in a lower guide, separate from each other by an air zone, the contact probes comprising at least one enlarged portion suitable for preventing the escape of the contact probes from the guiding holes. The enlarged portions of adjacent contact probes according to a direction of distribution of contact pads of an integrated device to be tested have respective larger sides orthogonal to one another.

More in particular, the disclosure comprises the following additional and optional features, taken individually or in combination as needed.

According to an aspect of the disclosure, the contact pads may be arranged as a matrix and the enlarged portions of the adjacent contact probes according to both a longitudinal direction and a cross direction have respective larger sides orthogonal to one another.

According to another aspect of the disclosure, the enlarged portions of the contact probes may have a greater section with respect to the section of a body of the probes, in particular at least one diameter larger than the diameter of said body, by diameter meaning a dimension with greater extension of respective sections of the enlarged portions and the body.

According to yet another aspect of the disclosure, each contact probe may further comprise a tip portion, tapered and ending with a contact tip that abuts on one of the contact pads.

Moreover, according to an aspect of the disclosure, each contact probe may further comprise a tip portion, provided with at least one blade for the contact with bumps of the integrated device to be tested in correspondence of the contact pads.

According to this aspect of the disclosure, the blades of adjacent probes may be orthogonal to one another.

As an alternative, the blades of adjacent probes may be parallel to one another.

Always according to this aspect of the disclosure, the blades may be made of a material harder than the material making the contact probes.

In particular, the blades may be made of rhodium and the contact probes may be made of a nickel alloy.

Finally, according to another aspect of the disclosure, the contact probes may have sections with a diameter ranging from 0.6 mils to 3 mils, and the enlarged portions may have sections with a diameter ranging from 0.8 mils to 3.5 mils.

The features and the advantages of the testing head according to the present disclosure will appear more clearly from the following description of an embodiment thereof, made by way of an indicative non-limiting example with reference to the annexed drawings.

BRIEF DESCRIPTION OF THE SEVERAL VIEWS OF THE DRAWINGS

FIG. 2A schematically shows a pair of adjacent contact probes, made according to the prior art;

FIGS. 2B and 2C schematically show configurations of contact pads of a device to be tested and the corresponding contact probes, made according to the prior art;

FIG. 4 schematically shows a matrix configuration of contact pads of a device to be tested and of the corresponding contact probes, for a testing head according to the first embodiment of the disclosure;

FIGS. 7A and 7B schematically show matrix configurations of contact pads and of the corresponding contact probes, according to the embodiments of FIGS. 6A and 6B, respectively.

DETAILED DESCRIPTION

Figures 1A, 1B:
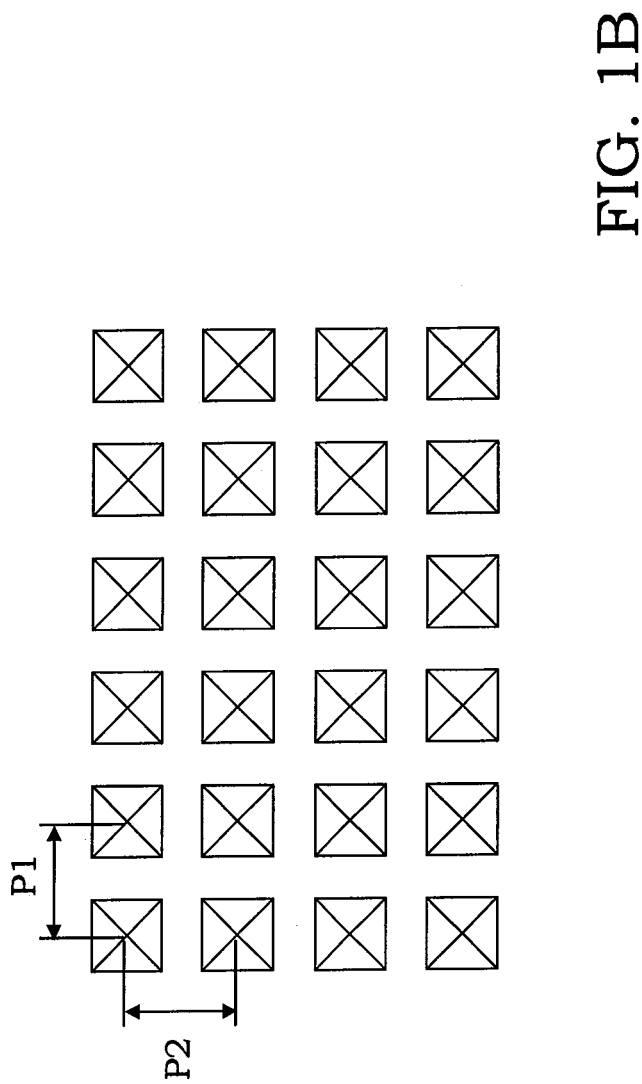
FIGS. 1A and 1B schematically show configurations of contact pads of a device to be tested, made according to the prior art.
Figure 3:
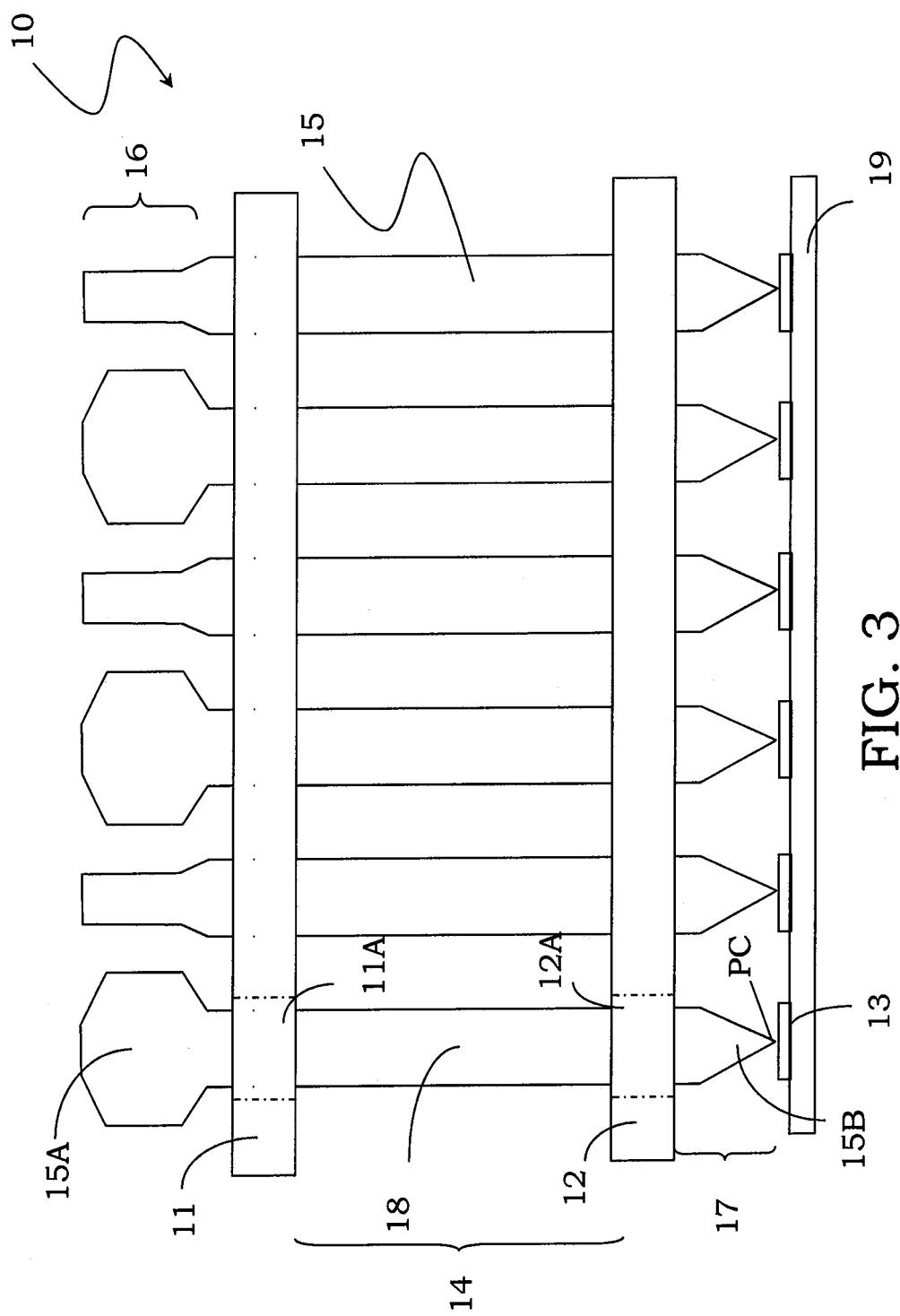
FIG. 3 schematically shows a testing head of integrated devices, according to a first embodiment of the disclosure.

With reference to such figures, and in particular to FIG. 3, a testing head comprising a plurality of contact probes for testing electronic devices, in particular integrated on wafer, according to an embodiment of the present disclosure, is globally indicated with 10.

It should be noted that the figures show schematic views of the testing head according to the embodiments of the disclosure and are not drawn in scale, but are drawn so as to emphasize the important features of the disclosure.

Moreover, the different aspects of the disclosure shown by way of an example in the figures may of course be combined with one another and are interchangeable from one embodiment to another.

The testing head 10 seats a plurality of contact probes 15 and comprises at least one upper guide 11 and one lower guide 12, provided with respective guiding holes 11A and 12A wherein the contact probes 15 slide.

According to an aspect of the disclosure, each contact probe 15 comprises a so-called probe body 18 and has a first end portion 15A, in particular "squeezed" or in any case more generally an enlarged portion with respect to the probe body 18.

As already seen in relation to the prior art, the enlarged portion 15A of the contact probe 15 allows ensuring that such probe cannot be removed from the corresponding guiding holes, 11A and 12A, made in the upper and lower guides, 11 and 12. To this end, the enlarged portion 15A has a larger section than the section of the probe body 18, in particular at least one diameter larger than the diameter of the probe body 18, where by diameter is meant the dimension with greater extension of such sections.

The contact probe 15 further comprises a second end portion, or tip portion 15B, tapered and ending with a contact tip PC that abuts on a contact pad 13 of an integrated device 19 to be tested.

The tip portion 15B may be shaped so as to define a substantially point-wise contact, or it may have a rounded shape or still it may have a substantially flat shape.

More in particular, as shown in the figure, the probe body 18 substantially extends in an air zone 14 between the upper guide 11 and the lower guide 12, whereas the enlarged portion 15A of the contact probe 15 extends between the testing head 10 and a space transformer (not shown) in an upper zone 16 and the tip portion 15B extends in a lower zone 17 between the lower guide 12 and the integrated device 19 to be tested. For convenience, the terms "upper" and "lower" are used in relation to a local reference system of the figure, without limiting in any way the invention.

In particular, the upper and lower guides, 11 and 12, are suitably shifted with respect to each other so as to impress a pre-deformation to the contact probes 15 that slide into their guiding holes in correspondence of the air zone 14 between the guides, such pre-deformation increasing during the working of the testing head 10, when the contact probes 15 are in pressing contact on the pads of the device to be tested 19 and bend at the air zone 14.

The testing head 10 is further associated in a known manner to a space transformer, in turn associated to a load board. In this way, an end portion of a test equipment of an integrated device is obtained.

In particular, the contact probes 15 have sections, in particular in correspondence of the probe body 18, with a diameter ranging from 0.6 mils to 3 mils, selected according to the applications the testing head 10 is intended for, where by diameter it is meant a maximum dimension of such section not necessarily circular whereas the enlarged portions 15A have sections with a diameter ranging from 0.8 mils to 3.5 mils.

According to an aspect of the disclosure, the enlarged portions 15A of adjacent contact probes 15 are suitably arranged so as to have respective larger sides orthogonal to one another. It is noted that "adjacent" probes are those consecutive according to the distribution direction of the corresponding contact probes 13 of the integrated device 19 to be tested, as well as those consecutive according to both a longitudinal direction and to a cross direction in the case of a matrix distribution of the contact pads 13. Moreover, as already indicated in relation to the known solutions, the enlarged portions 15A are substantially "squeezed" and therefore have a side larger than the other, the larger sides of such portions of two adjacent probes being suitably arranged so as to be perpendicular to one another.

Such arrangement of the enlarged portions 15A of the contact probes 15 is even more clear in FIG. 4, where there are shown the alternating arrangements of the enlarged portions 15A of the contact probes 15 of a testing head 10 according to this first embodiment of the disclosure.

In particular, the example of FIG. 4 shows a matrix arrangement of the contact pads 13, the enlarged portion 15A of each contact probe 15 being arranged so as to be perpendicular to both the adjacent probe according to a longitudinal direction X, and to the adjacent probe according to a cross direction Y, as shown in the figure.

To clarify such arrangement, the figure only shows the enlarged portions 15A of the contact probes 15, by way of an example with rectangular section. Of course, a totally similar arrangement may be obtained starting from probes with circular section, with enlarged portions 15A with a substantially oval section.

It can be immediately seen that the testing head 10 according to the first embodiment shown in FIG. 3 and in particular the arrangement of the enlarged portions 15A thereof, as shown in FIG. 4, allow moving the contact probes 15 closer, to shorter distances compared to the known solutions, without the risk of contact between the adjacent probes, in particular between the enlarged portions 15A thereof. In this way, advantageously according to the disclosure, it is possible to reduce the pitch of the integrated device 19 to be tested, that is, move the centers of the corresponding contact pads 13 closer, up to the requirements of the most modern integration and design technologies of integrated circuits.

Figure 6A:
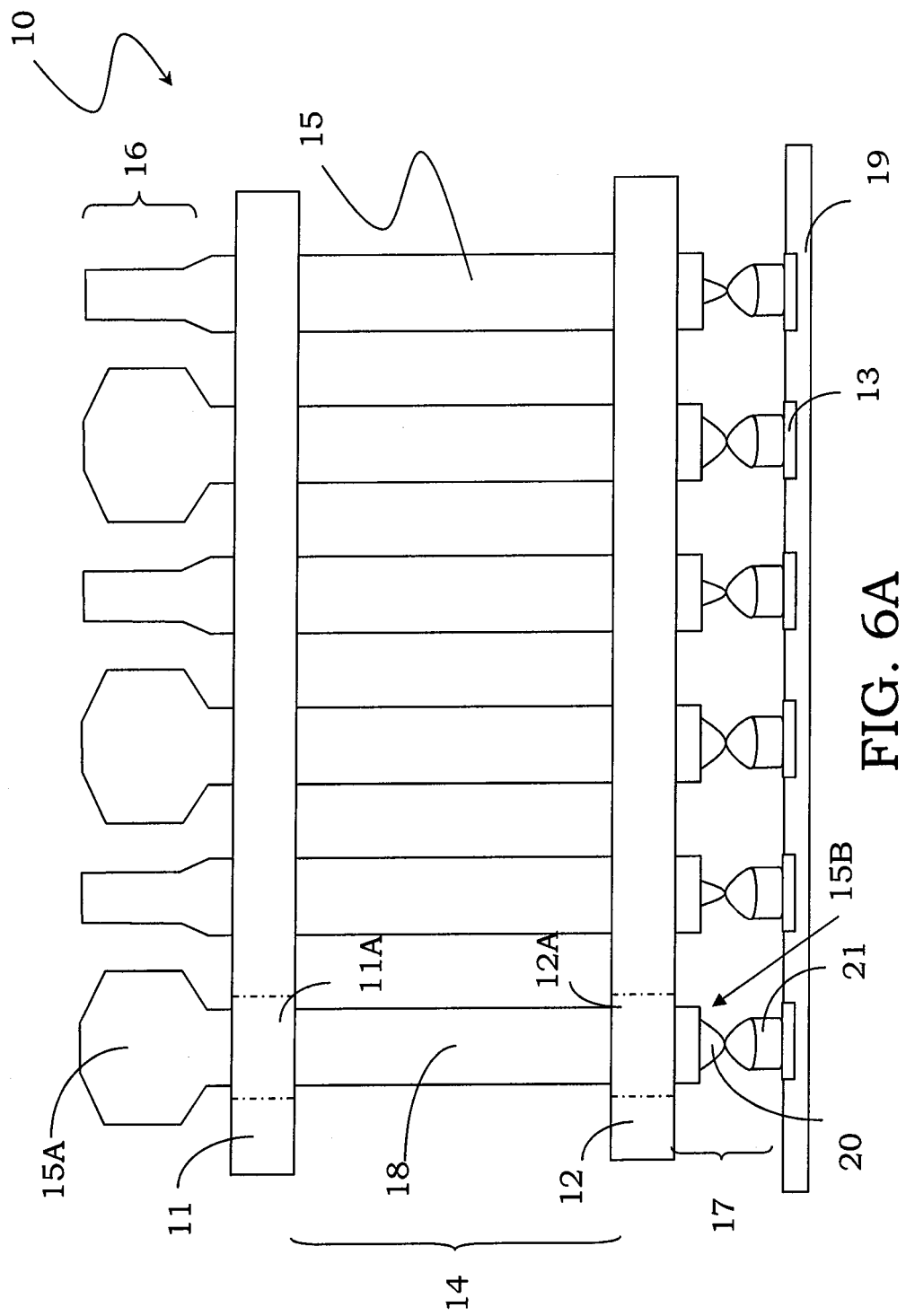
FIGS. 6A and 6B schematically show a testing head of integrated devices, according to a second and a third embodiment of the disclosure.

A second embodiment of the testing head 10 according to the disclosure is shown in FIG. 6A, for the contact with bumps rather than pads.

Figure 5A:
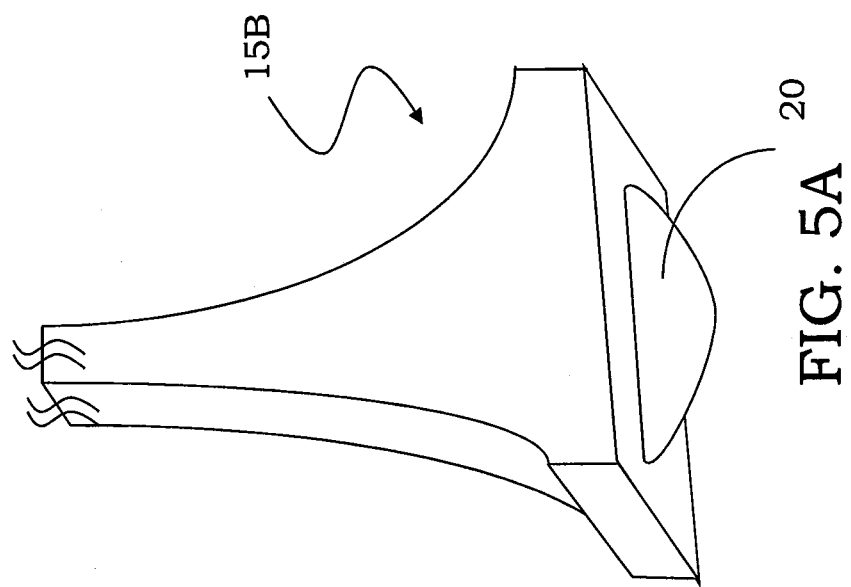
FIGS. 5A and 5B schematically show a contact probe for the contact with bumps of an integrated device to be tested and the corresponding bumps, respectively.
Figure 5B:
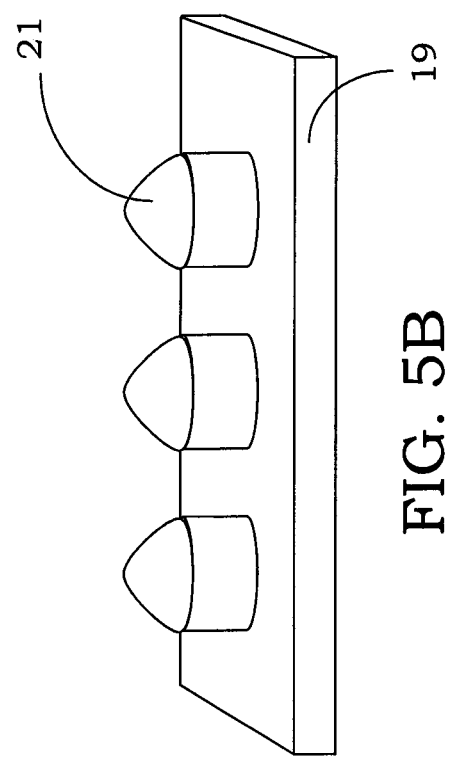

Integrated devices are in fact known, which have three-dimensional contact zones, so-called bumps, projecting from an end surface of the same device in correspondence of the contact pads 13, according substantially to a muffin shape, as schematically shown in FIG. 5B and indicated with reference numeral 21. In this case, it is known to provide the contact probes 15 with a tip portion 15B having a cutting device, in particular a blade 20, as schematically shown in FIG. 5A. Such blade 20 is normally made of an especially hard material, such as rhodium, compared to the contact probe 15 that is normally made of nickel alloys.

The blade 20 of each contact probe 15 cuts the corresponding bump 21 on the surface, partly penetrating the same and obtaining the desired scrub. Of course, such cut must be limited so as to not damage the bump irreparably.

In particular, the testing head 10 according to the second embodiment of the disclosure shown in FIG. 6A therefore comprises, in correspondence of the tip portion 15B thereof, a blade 20 for the contact with a respective bump 21.

According to an aspect of the disclosure, the enlarged portions 15A of adjacent contact probes 15 are suitably arranged so as to have respective larger sides orthogonal to one another.

In that case, also the corresponding blades 20 of adjacent probes in turn are orthogonal.

Due to the arrangement of the enlarged portions 15A and of blades 20 of the contact probes 15, bumps 21 will be cut according to perpendicular directions, as schematically shown in FIG. 7A.

Figure 6B:
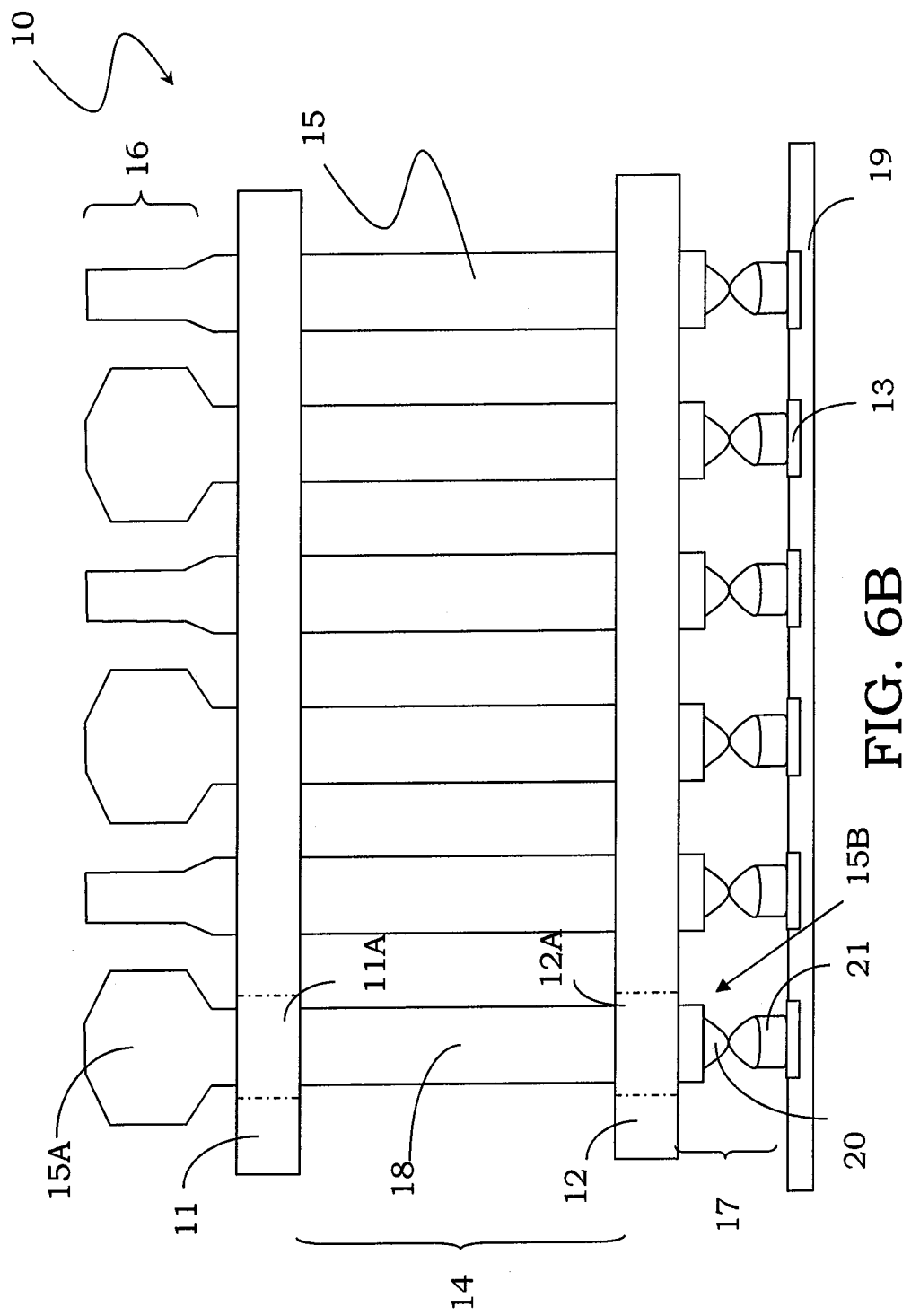

According to a third embodiment of the disclosure, schematically shown in FIG. 6B, the testing head 10 comprises contact probes 15 with enlarged portions 15A and blades 20 arranged in parallel, meaning that the larger side of the enlarged portion 15A is arranged in the same direction as blade 20 alternating to contact probes 15 with enlarged portions 15A and blades 20 arranged perpendicular to one another, meaning that the larger side of the enlarged portion 15A is arranged in a direction orthogonal to blade 20. In this way, it is possible to obtain cuts on the bumps 21 that are all parallel to one another, as schematically shown in FIG. 7B.

Also in this case, the testing head 10 according to the second and third embodiments shown in FIGS. 6A and 6B and in particular thanks to the arrangement of the enlarged portions 15A thereof and of blades 20, as shown in FIGS. 7A and 7B, allows moving the contact probes 15 closer up to shorter distances compared to the known solutions, without the risk of contact between the adjacent probes, in particular between the enlarged portions 15A thereof.

In conclusion, the testing head according to the embodiments of the disclosure allows a high packing of the contact probes and the testing of evenly highly nearby contact pad configurations, the limit being given by the section of the contact probes and not by the enlarged portions thereof, as it happens with known devices.

In this way, advantageously according to the disclosure, it is possible to reduce the pitch of the integrated device to be tested, that is, move the centers of the relative contact pads closer, up to the requirements of the most modern integration and design technologies of integrated circuits.

From the foregoing it will be appreciated that, although specific embodiments of the disclosure have been described herein for purposes of illustration, various modifications may be made without deviating from the spirit and scope of the disclosure.

The invention claimed is:

1. A testing head for test equipment for testing electronic devices comprising:
an upper guide provided with guiding holes;
a lower guide provided with guiding holes; and
a plurality of contact probes inserted in the guiding holes of the upper and lower guides, wherein:
the upper and lower guides are separated from each other by an air zone;
each contact probe includes a probe body extending through the upper and lower guides and the air zone and an enlarged portion suitable for preventing escape of the contact probe from the guiding holes of the upper and lower guides, the enlarged portion being positioned above the upper guide that the upper guide is between the enlarged portion and the air zone and the enlarged portion having first and second cross-sectional dimensions, the first cross-sectional dimension being larger than the second cross-sectional dimension and being larger than a largest cross-sectional dimension of the probe body; and
the first cross-sectional dimensions of the enlarged portions of adjacent contact probes along a direction of distribution of contact pads of an integrated device to be tested are orthogonal to one another.

2. The testing head of claim 1, wherein the contact pads are arranged as a matrix and the first cross-sectional dimensions of the enlarged portions of adjacent contact probes along both a longitudinal direction and a cross direction are orthogonal to one another.

3. The testing head of claim 1, wherein each contact probe further comprises a tip portion, tapered and ending with a contact tip that abuts on one of the contact pads.

4. The testing head of claim 1, wherein each contact probe further comprises a tip portion, provided with at least one blade for contact with bumps of the integrated device to be tested in correspondence of the contact pads.

5. The testing head of claim 4, wherein the blades of adjacent probes are orthogonal to one another.

6. The testing head of claim 4, wherein the blades of adjacent probes are parallel to one another.

7. The testing head of claim 4, wherein the blades are made of a material harder than a material of the probe bodies.

8. The testing head of claim 7, wherein the blades are made of rhodium and said probe bodies are made of a nickel alloy.

9. The testing head of claim 1, wherein the largest cross-sectional dimensions of the probe bodies range from 0.6 mils to 3 mils, and first cross-sectional dimensions of the enlarged portions range from 0.8 mils to 3.5 mils.

10. A testing head for test equipment for testing electronic devices comprising:
an upper guide provided with guiding holes;
a lower guide provided with guiding holes, the upper and lower guides being separated from each other by an air zone; and
a plurality of contact probes inserted in the guiding holes of the upper and lower guides, each contact probe comprising:
a probe body extending through the upper and lower guides and the air zone;
an enlarged portion suitable for preventing escape of the contact probe from the guiding holes of the upper and lower guides, the enlarged portion being positioned above the upper guide such that the upper guide is between the enlarged portion and the air zone and the enlarged portion having first and second cross-sectional dimensions, the first cross-sectional dimension being large than the second cross-sectional dimension and being larger than a largest cross-sectional dimension of the probe body; and
a tip portion including a blade for contact with a bump of a plurality of bumps in correspondence with contact pads of an integrated device to be tested,
wherein the first cross-sectional dimensions of the enlarged portions of adjacent contact probes along a direction of distribution of the contact pads of the integrated device to be tested are orthogonal to one another.

11. The testing head of claim 10, wherein the contact pads are arranged as a matrix and the first cross-sectional dimensions of the enlarged portions of adjacent contact probes along both a longitudinal direction and a cross direction are orthogonal to one another.

12. The testing head of claim 10, wherein the blades of adjacent probes are orthogonal to one another.

13. The testing head of claim 10, wherein the blades of adjacent probes are parallel to one another.

14. The testing head of claim 10, wherein the blades are made of a material harder than a material of the probe bodies.

15. The testing head of claim 14, wherein the blades are made of rhodium and said probe bodies are made of a nickel alloy.

16. The testing head of claim 10, wherein the largest cross-sectional dimensions of the probe bodies range from 0.6 mils to 3 mils, and the first cross-sectional dimensions of the enlarged portions range from 0.8 mils to 3.5 mils.

17. A testing device, comprising:
a space transformer; and
a testing head positioned adjacent to the space transformer and including:
an upper guide provided with guiding holes;
a lower guide provided with guiding holes, the upper and lower guides being separated from each other by an air zone; and
a plurality of contact probes inserted in the guiding holes of the upper and lower guides, each contact probe comprising:
a probe body extending through the upper and lower guides and the air zone;
an enlarged portion suitable for preventing escape of the contact probe from the guiding holes of the upper and lower guides, the enlarged portion being positioned in an upper zone between the upper guide and the space transformer and the enlarged portion having first and second cross-sectional dimensions, the first cross-sectional dimension being larger than the second cross-sectional dimension and being larger than a largest cross-sectional dimension of the probe body; and
a tip portion including a blade for contact with a bump of a plurality of bumps in correspondence with contact pads of an integrated device to be tested, wherein the first cross-sectional dimensions of the enlarged portions of adjacent contact probes along a direction of distribution of the contact pads of the integrated device to be tested are orthogonal to one another.

18. The testing device of claim 17, wherein the contact pads are arranged as a matrix and the first cross-sectional dimensions of the enlarged portions of adjacent contact probes along both a longitudinal direction and a cross direction are orthogonal to one another.

* * * * *